(12) United States Patent
Tohsche

(10) Patent No.: US 6,515,528 B1
(45) Date of Patent: Feb. 4, 2003

(54) FLIP-FLOP CIRCUIT

(75) Inventor: Ulf Tohsche, Itzehoe (DE)

(73) Assignee: Infineon Technologies AG, Munich (DE)

( * ) Notice: Subject to any disclaimer, the term of this patent is extended or adjusted under 35 U.S.C. 154(b) by 393 days.

(21) Appl. No.: 10/009,113

(22) PCT Filed: Jun. 5, 2000

(86) PCT No.: PCT/DE00/01822

§ 371 (c)(1),
(2), (4) Date: Mar. 20, 2002

(87) PCT Pub. No.: WO00/76071

PCT Pub. Date: Dec. 14, 2000

(51) Int. Cl.$^7$ ............................................. H03K 3/289
(52) U.S. Cl. ......................... 327/203; 327/211; 327/218
(58) Field of Search ................................. 327/202, 203, 327/210, 211, 212, 217, 218, 199, 214

(56) References Cited

U.S. PATENT DOCUMENTS

| | | | | |
|---|---|---|---|---|
| 4,356,411 A | * | 10/1982 | Suzuki et al. ................ | 327/203 |
| 5,532,634 A | * | 7/1996 | Sato ............................ | 327/203 |
| 5,821,791 A | * | 10/1998 | Gaibotti et al. ............. | 327/202 |
| 5,905,393 A | * | 5/1999 | Rinderknecht et al. ..... | 327/202 |
| 6,314,016 B1 | * | 11/2001 | Takasu ........................ | 327/203 |

FOREIGN PATENT DOCUMENTS

| | | |
|---|---|---|
| EP | 0 692 872 A2 | 1/1996 |
| EP | 0 760 558 A1 | 3/1997 |
| EP | 0 768 758 A1 | 4/1997 |
| EP | 0 793 342 A2 | 9/1997 |
| WO | WO 97/15116 | 4/1997 |

OTHER PUBLICATIONS

English Translation of PCT International Preliminary Examination Report, dated Jul. 31, 2001, 7 pgs.
IBM Technical Disclosure Bulletin, *Combined Sense Amplifier and LSSD Latch*, vol. 34, No. 10A, Mar. 1992.
Patent Abstract of Japan, *Single Phase Static Type D Flip-Flop Circuit*, vol. 009, No. 295, Publication No. 60134623, Publication Date Jul. 17, 1985.
R. Sharma et al., *IEEE Journal of Solid–State Circuits*, 24(4);922–927 (1989).
J. Yuan *IEEE Journal of Solid State Circuits*, 32(1):62–69 (1997).
C. Svensson et al., "Latches and Flip–Flops for Low Power Systems", pp. 233–238.

* cited by examiner

*Primary Examiner*—Toan Tran
(74) *Attorney, Agent, or Firm*—Peter F. Corless; Christine C. O'Day; Edwards & Angell, LLP

(57) ABSTRACT

A flip-flop circuit comprises a master latch circuit (2), which receives an input signal (D), and, connected in series therewith, a slave latch circuit (3), the two latch circuits (2, 3) being actuated complementarily-to one another by a clock signal. The output signal value (Q,Q̄) of the flip-flop circuit is emitted from the output of the slave latch circuit (3) not directly but via a non-differential output driver circuit (4), e.g. an inverter circuit.

8 Claims, 3 Drawing Sheets

| $CP_n$ | $D_n$ | $Q_{n+1}$ |
|---|---|---|
| 0 | 0 | $Q_n$ |
| 0 | 1 | $Q_n$ |
| 1 | 0 | 0 |
| 1 | 1 | 1 |

FLIP-FLOP CIRCUIT

The present invention relates to a flip-flop circuit, and particularly to a D flip-flop circuit, as detailed in the preamble to claim 1.

Flip-flops, or bistable latches, are circuits that perform a storage function where the output signal depends both on the instantaneous value of the input signal and on the previous history. For this reason flip-flops are also referred to as sequential switching devices.

A D flip-flop is so constructed that it receives a binary input signal which is transferred to its output as a function of a clock signal CP applied to it. FIG. 6 shows the truth table for a D flip-flop, with the output signal value $Q_{n+1}$ shown as a function of the instantaneous value of the clock signal $CP_n$ and the instantaneous value of the input signal $D_n$. It can be seen from FIG. 6 that the output value Q from the D flip-flop only changes when the value of the clock signal is binary '1'. When this is the case, the instantaneous value of the input signal D is transferred to become the output value D. In all other cases the output value Q from the D flip-flop remains unchanged. The D flip-flop can be designed to switch at either a rising or decaying edge of the clock signal.

Transistors are obvious candidates as switches for producing flip-flop circuits or bistable latch circuits. It is known that a flip-flop circuit can in particular be constructed from two directly coupled CMOS-type inverters.

There are however many applications, such as counters or shift registers, for which the simple flip-flop circuits described above are not suitable, because what are needed in this case are flip-flops which first buffer-store the state of the input signal and then only transfer it to the output when the input of the flip-flop is "blocked" again by the clock signal.

Flip-flop circuits of this kind therefore comprise two flip-flops or memory cells (latch circuits) connected in series, namely a so-called master latch and a so-called slave latch, and they are therefore also referred to as master-slave flip-flops. The master latch receives the input signal D at its input and its output is connected to the input of the slave latch. The output signal Q from the master-slave flip-flop can be picked off from the output of the slave latch. The master latch and slave latch are switched complementarily to one another by means of the clock signal CP.

If the clock signal CP='0' for example, the instantaneous value of input signal D is read into the master latch and stored in it. Initially the output state Q of the slave latch remains unaltered, because the slave latch is blocked by the clock signal. When the clock signal then changes to CP='1', the master latch is blocked and the instantaneous value at the output of the master latch, which had previously been read in, is transmitted to the output of the slave latch and is emitted as the output signal value Q from the master-slave flip-flop. Hence in master-slave flip-flops of this kind, in contrast to what happens in simple flip-flop circuits, there is no state of the clock signal in which the input signal D acts directly on the output signal Q.

In the citation "New Single-Clock CMOS Latches and Flipflops with Improved Speed and Power Savings", Jiren Yuan and Christer Svenson, IEEE Journal of Solid-State Circuits, Vol.32, No.1, January 1997, pp.62–69, a flip-flop circuit as detailed in the preamble to claim 1 is disclosed. In this citation it is proposed that a low-power D flip-flop be constructed from two differentially acting D flip-flops or memory cells (latches) connected in series. Each flip-flop comprises two directly coupled CMOS-type inverters connected in series. What in particular is proposed is that the master latch be constructed in the form of a differentially acting p-latch and the slave latch in the form of an n-latch, also differentially acting. The output signals $Q,\overline{Q}$ are picked off directly from internal nodes in the slave latch. Alternatively, the output of the slave latch can be connected to a final differential memory cell or latch circuit. In this case too, the output signals $Q,\overline{Q}$ are then picked off from internal nodes of the differential latch which terminates the flip-flop circuit.

Picking off the output signals $Q,\overline{Q}$ from the internal node of the slave latch is however a disadvantage in that the load to be driven by the output of the flip-flop affects the slave latch and in particular it causes the slave latch to switch more slowly and a short-circuit current to flow for a long period across at least one of its two inverters.

The object of the present invention is therefore to provide a flip-flop circuit having a low power demand in which it is also possible to achieve a constant, high switching speed for the slave latch.

This object is achieved in accordance with the invention by a flip-flop circuit having the features detailed in claim 1. The subclaims define advantageous and preferred embodiments of the present invention.

In accordance with the invention the output of the flip-flop circuit is isolated from the internal nodes of the slave latch by inserting a non-differential output driver circuit. The output driver circuit may for example be designed to take the form of an inverter circuit. The isolation of the load to be driven by the output from the internal nodes of the slave latch means that it is possible to obtain for the slave latch a switching speed which is independent of the output load to be driven and which is thus high and constant. The capacitances which have to be discharged and recharged by the internal nodes of the slave latch are thus known and allow the sizes of the field-effect transistors to be optimised, in a way suited to all output loads, to give a power consumption which is as low as possible and a switching speed which is as high as possible.

In particular, the flip-flop circuit according to the invention manages with only a minimal number of clock-signal transistors, namely two clock-signal transistors. Since the clock signal is the signal in a flip-flop circuit which is subject to the most changes of state, it generally has a particularly significant bearing on the energy consumption of the flip-flop circuit.

Even without that, the flip-flop circuit according to the invention still has fewer transistors than other low-power flip-flop circuits known hitherto and can therefore be produced in a more compact form on chips. This applies particularly to the design of the master latch. The clock-signal transistor of the slave latch, which triggers the acceptance of the signal value present at the output of the master latch, is situated close to the output of the circuit, which means that there is less delay to the signal, whereas in certain solutions known previously the clock signal was processed in a number of successive stages.

The invention will be explained in detail below by reference to the accompanying drawings and to preferred embodiments.

Figure 1:
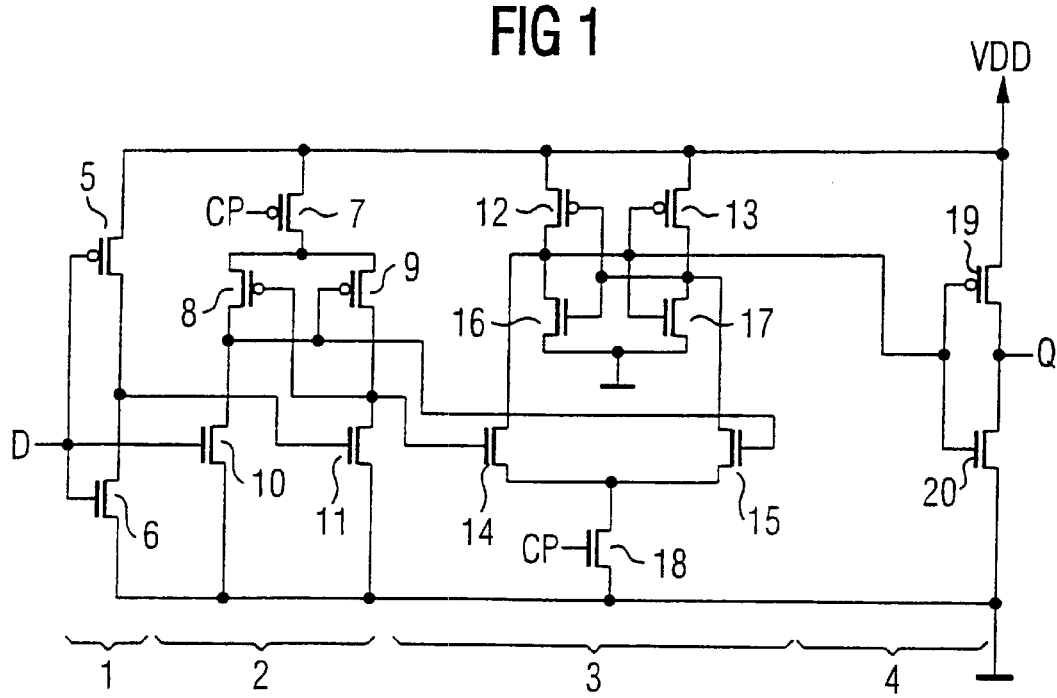
FIG. 1 is a circuit diagram of a first embodiment of the present invention.

In FIG. 1 is shown the circuit of a D flip-flop in which the present invention is applied.

The D flip-flop shown in FIG. 1 is designed as a master-slave flip-flop and comprises a master latch circuit 2 and a slave latch circuit 3 connected in series therewith, each of which is produced by CMOS techniques.

Both the master latch 2 and the slave latch 3 comprise two directly coupled circuits composed of series-connected transistors, these being formed in the master latch 2 by a p-channel field effect transistor 8 and an n-channel field effect transistor 10 and by a p-channel field effect transistor 9 and an n-channel field effect transistor 11, whereas in the slave latch 3 they are formed by a p-channel field effect transistor 12 and an n-channel field effect transistor 14 and by a p-channel field effect transistor 13 and an n-channel field effect transistor 15. The slave latch $2^2$ also comprises n-channel field effect transistors 16 and 17 connected as shown in FIG. 1 which, together with p-channel field effect transistors 12 and 13 respectively, each form a CMOS inverter.

In the embodiment shown in FIG. 1, the master latch 2 is driven, via a p-channel field effect transistor 7 connected as shown in FIG. 1, by a clock signal CP, clock signal CP also being applied to slave latch 3, but via an n-channel field effect transistor 18. In this way the two latches 2 and 3 are actuated by the clock signal complementarily to one another, with the master latch 2 being activated by CP='0' and the slave latch 3 being activated by CP='1'.

The input signal D to the D flip-flop circuit is applied to the master latch 2 or rather to its n-channel field effect transistor 10. Also provided at the input end is an inverter circuit 1 having a p-channel field effect transistor 6 and, connected in series therewith, an n-channel field effect transistor 6, whose output signal is applied to n-channel field effect transistor 11, so that the master latch 2 has not only the input signal D but also the negated input signal $\overline{D}$ applied to it.

At the output of slave latch 3, the output signal Q arises at the node between transistors 13 and 15 of slave latch 3 and its negated value $\overline{Q}$ arises at the node between transistors 12 and 14.

If the state of the clock signal is CP='0', the instantaneous value of the input signal D is read into the master latch 2 and stored there. The state of the output of the slave latch remains unaltered for the time being because the slave latch is blocked by clock signal CP. When the state of the clock signal then changes to CP='1', the master latch 2 is blocked and the instantaneous value at the output of master latch 2, which was previously read in, is transmitted to the output of slave latch 3.

As can be seen from the circuit shown in FIG. 1, the output signal Q is not picked off directly from the output of slave latch 3 but is emitted via a non-differential output driver circuit 4. In the embodiment shown in FIG. 1 this output driver circuit 4 is designed particularly as a CMOS inverter circuit having a p-channel field effect transistor 19 and an n-channel field effect transistor 20. The input of this inverter circuit is connected to the node between transistors 12 and 14 where the negated output signal value $\overline{Q}$ arises, so that the output signal Q is emitted by inverter circuit 4 from an output which is decoupled from the internal nodes of the slave latch 3.

Figure 2:
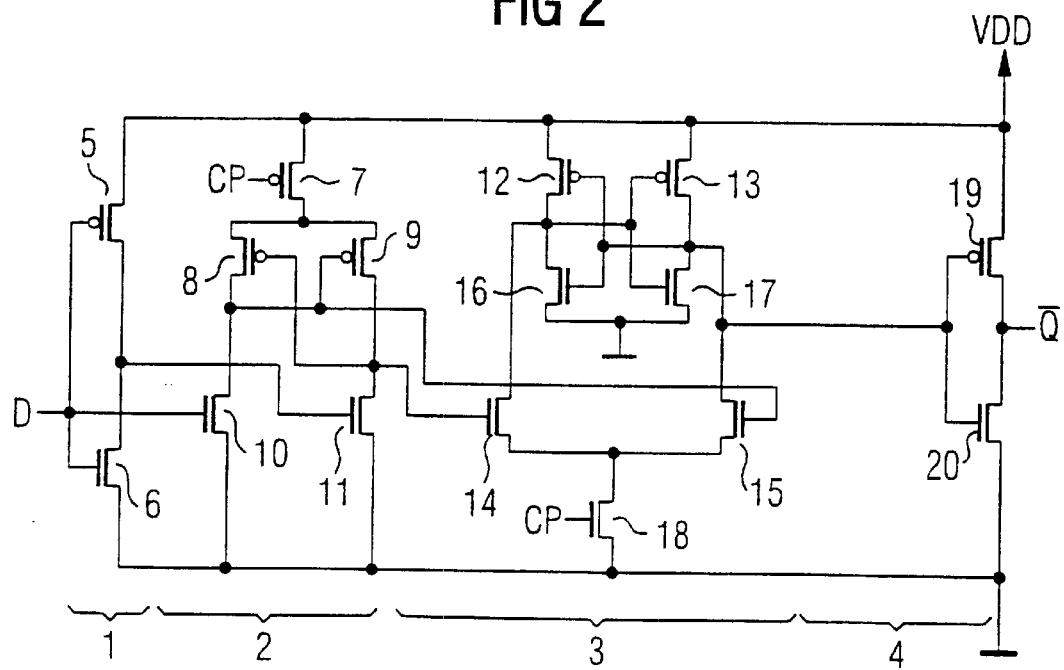
FIG. 2 is a circuit diagram of a second embodiment of the present invention.

In FIG. 2 is shown the corresponding D flip-flop circuit to put out the negated output signal $\overline{Q}$, the inverter being connected to the node between transistors 13 and 15 in this case. The circuit shown in FIG. 2 thus constitutes an inverting D flip-flop circuit.

Figure 3:
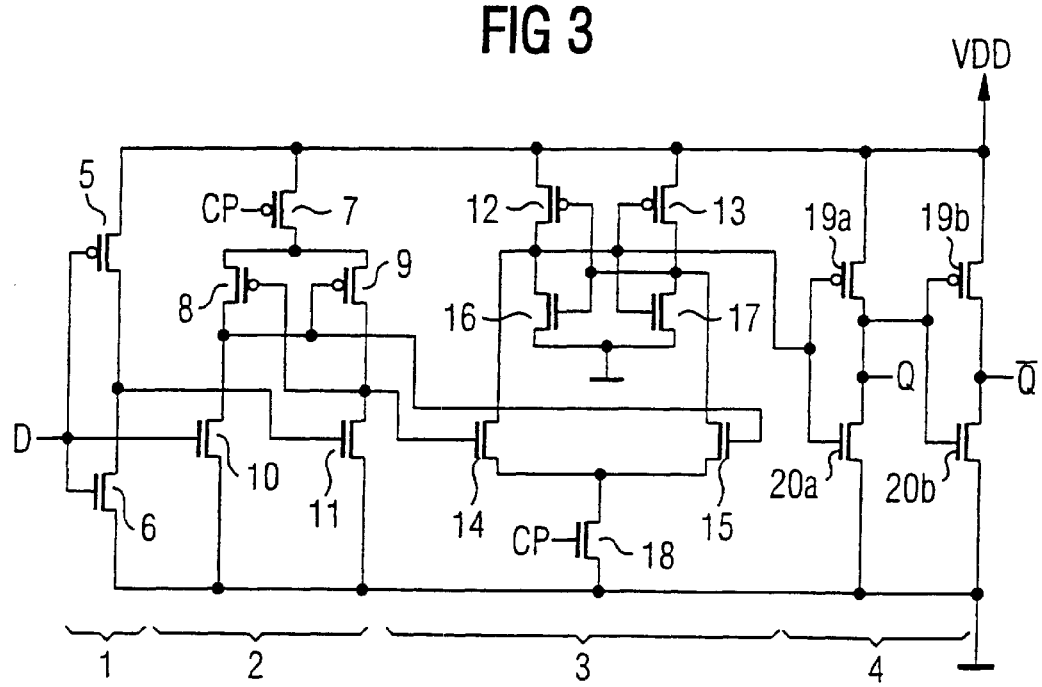
FIG. 3 is a circuit diagram of a third embodiment of the present invention.

FIG. 3 shows a flip-flop circuit based on the principle according to the invention which has an inverted output and a non-inverted output. In a way similar to what is shown in FIG. 1, the input of a first inverter circuit having a p-channel field effect transistor 19a and an n-channel field effect transistor 20a is connected to the node between transistors 12 and 14 of slave latch 3, which means that the output signal value Q can be picked off from the output of this inverter circuit. The output of this first inverter circuit 19a, 20a is connected to a further inverter 19b, 20b made up in exactly the same way, thus allowing the inverted output signal $\overline{Q}$ to be picked off from the output of the further inverter. In this way both Q and $\overline{Q}$ are output from a non-differential output driver circuit not directly connected to the internal nodes of slave flip-flop 3, and the load to be driven by the D flip-flop is decoupled from the internal nodes of slave flip-flop 3.

Figure 4:
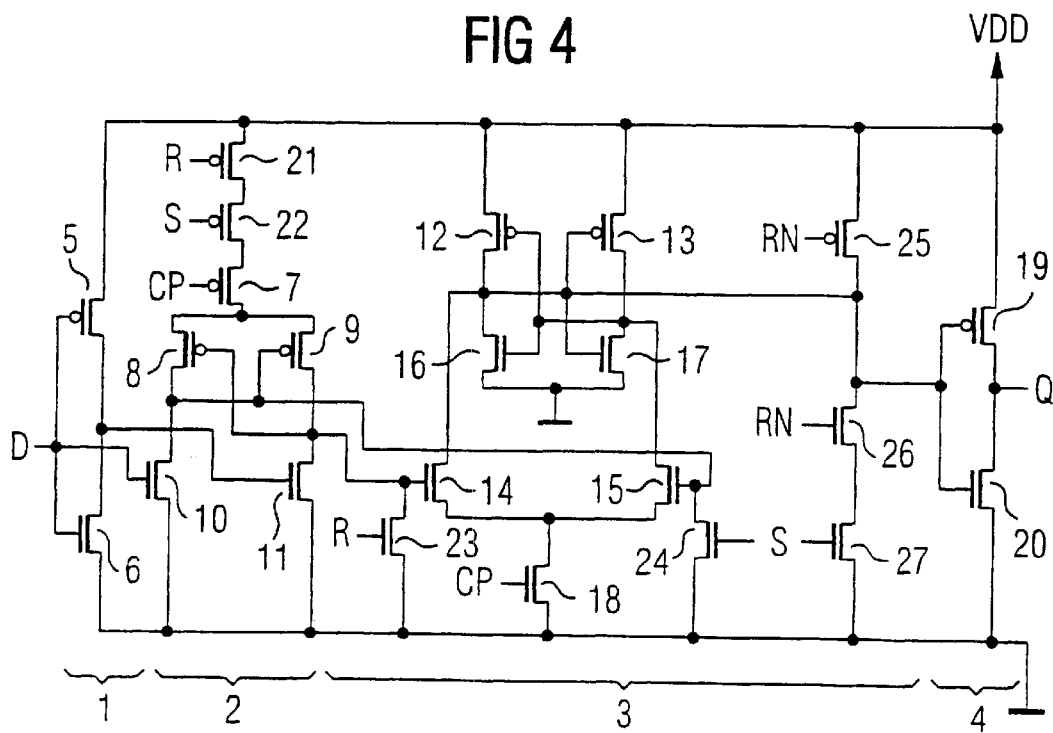
FIG. 4 is a circuit diagram of a fourth embodiment of the present invention.

FIG. 4 shows a further embodiment of the present invention, which corresponds to the embodiment shown in FIG. 1 but has been expanded to include a set and reset function. For this purpose, both the master latch 2 and the slave latch 3 have an input for the application of a setting signal S and an input for the application of a resetting signal R, thus making it possible for the flip-flop 2 or 3 concerned to be set specifically to the value '1' by means of the setting signal S, whereas it can be set specifically to the value '0' by means of the resetting signal R.

As shown in FIG. 4, the master latch 2 has provided for it p-channel field-effect transistors 22 and 21 for the setting signal S and resetting signal R respectively, which transistors are connected in series with the clock-signal transistor 7. The slave latch 3 on the other hand has provided for it n-channel field effect transistors 23 and 24 which are connected to the gates of n-channel field effect transistors 14 and 15 respectively, to allow the gate voltages of the latter to be set specifically to the value '0' when R='1' and S='1' respectively. The output of slave latch 3 is also provided with a set and reset function, transistors 25–27 shown in FIG. 4 being provided for this purpose, and the node between p-channel field effect transistor 25 and n-channel field effect transistors 26, 27 being connected to the internal node of slave flip-flop 3 between transistors 12 and 14. The negated reset signal RN is applied each time to p-channel field-effect transistor 25 and n-channel field-effect transistor 26, whereas the n-channel field-effect transistor receives the setting signal S. The purpose of transistors 25–27, and particularly of transistor 26, is to give the resetting signal priority when R='1' and S='1', i.e. the combination R='1' and S='1' is always permissible. If transistor 26 were dispensed with, the combination of R='1' and S='1' would not be permissible. Only when the combination is R='0' and S='0' does the flip-flop circuit perform the true function of a D flip-flop (see FIG. 6).

Figures 5, 6:
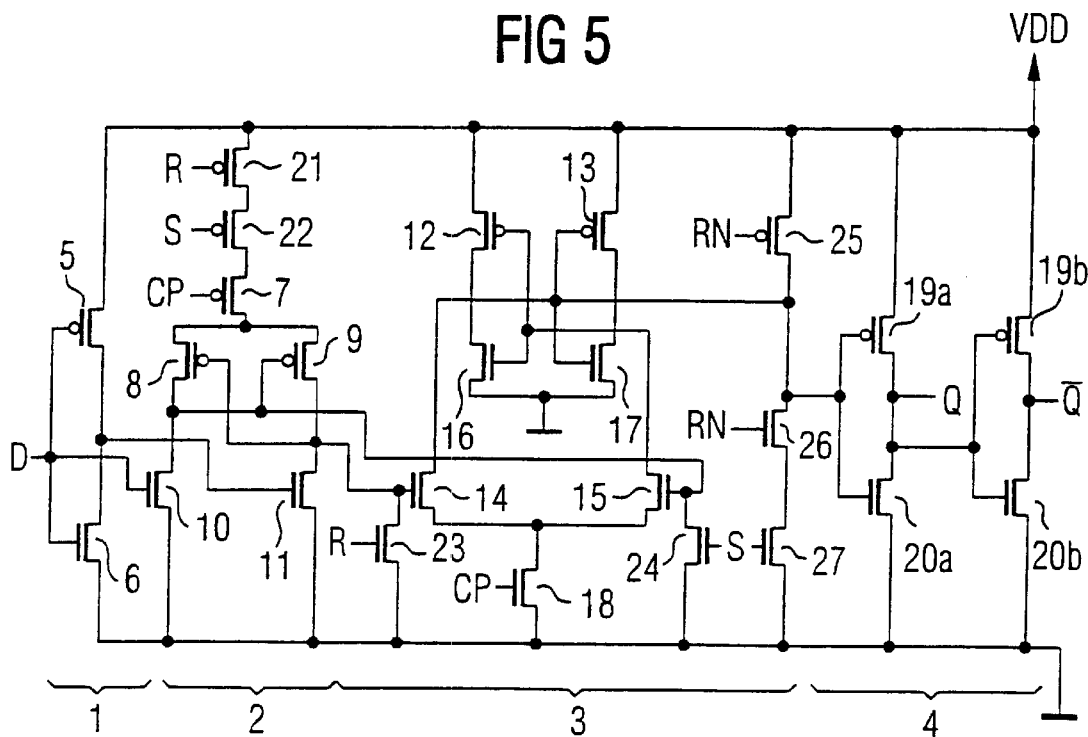
FIG. 5 is a circuit diagram of a fifth embodiment of the present invention.
FIG. 6 shows the truth table for a D flip-flop.

In FIG. 5, the flip-flop circuit shown in FIG. 3 having inverted and non-inverted outputs is expanded in a similar way to include the set and reset function, corresponding components having once again been given the same reference numerals so that there is no need for these components to be described again.

The D flip-flop circuits according to the invention which are shown in FIGS. 1–5 are each so constructed that they manage with a minimal number of transistors. Clock-signal transistors 7 and 18, which each time trigger the acceptance of the signal value applied to the appropriate input are situated, in the circuit layout actually produced, in the vicinity of the output of the corresponding flip-flop 2 or 3, thus ensuring that the delay times are only short. Due to special features of the circuit design, it is ensured that energy is only consumed in the D flip-flop circuits shown when switching takes place, i.e. when input signal D changes. The offset in power consumption which is independent of the activity of the flip-flop circuit is therefore less than in known solutions and comprises merely the power which has to be supplied by the clock network to drive clock-signal transistors 7 and 18.

Compared with the low-power D flip-flops used hitherto it has been possible with the circuits shown for the so-called power-delay product, i.e. the product of the power consumption of the flip-flop circuit multiplied by its delay time, to be reduced by approximately 80% when the flip-flop circuit is inactive (i.e. when Q=constant), by 49% when the flip-flop circuit is moderately active and by 36% when it is active to the maximum degree (when it is used as a frequency divider for example). The delay time in this case comprises the sum of the so-called setup time and the time delay proper of the flip-flop circuit. It has also been possible for power consumption to be reduced by approximately 66% when the circuit is inactive and by 16% at a moderate level of activity. The figures quoted above each apply for an output level probability of P(Q=1)=0.5. Lower output level probabilities raise the figures quoted, whereas conversely higher output level probabilities cause a reduction of the same size in the figures quoted. It has been possible for the delay time of the flip-flop circuit, i.e. the sum of the setup time and the delay time proper, to be reduced by around 39%, while the space required by the flip-flop circuit produced has been reduced by approximately 6.6%.

What is claimed is:

1. Flip-flop circuit having a first latch circuit to which a binary input signal and a binary clock signal are applied and which is so designed that it accepts the input signal value applied and switches it through to its output if the clock signal is in a first state, and having a second latch circuit to which the output signal of the first latch circuit and the clock signal are applied and which is so designed that it accepts the output signal value from the first flip-flop circuit and emits it as the output signal value of the flip-flop circuit if the clock signal is in a second state, wherein connected to the output of the second latch circuit is a non-differential output driver circuit from which the output signal value of the flip-flop circuit is emitted, wherein the first and second latch circuits are each bistable CMOS latch circuits having coupled to them controlling field-effect transistors to which the clock signal is applied and comprising switching means for setting and resetting the corresponding latch circuits, wherein the bistable CMOS latch circuits forming the first and second latch circuits each comprise, connected in parallel, two circuits each comprising a p-channel field-effect transistor connected in series with an n-channel field-effect transistor, the control connections of the p-channel field-effect transistors of one series circuit being connected in each case to the node of the other series circuit, wherein the switching means for setting and resetting the second latch circuit comprise a further controlling field-effect transistor which is coupled on the one hand to the n-channel field-effect transistor in the series circuit on the input side of the second latch circuit and on the other to the controlling field-effect transistor and to which a resetting signal is applied, and wherein the switching means for setting and resetting the second latch circuit further comprise a further controlling field-effect transistor which is coupled on the one hand to the n-channel field-effect transistor in the series circuit on the output side of the second latch circuit and on the other to the controlling field-effect transistor and to which a setting signal is applied.

2. Flip-flop circuit according to claim 1, wherein the non-differential output driver circuit is an inverter circuit whose input is connected to the output of the second latch circuit, the output signal value of the flip-flop circuit being emitted from the output of the inverter circuit.

3. Flip-flop circuit according to claim 1, wherein the non-differential output driver circuit comprises a first inverter circuit and a second inverter circuit, the input of the first inverter circuit being connected to the output of the second latch circuit and the input of the second inverter circuit being connected to the output of the first inverter circuit and the output signal value of the flip-flop circuit being emitted from the output of the first inverter circuit and the negated output signal value of the flip-flop circuit being emitted from the output of the second inverter circuit.

4. Flip-flop circuit according to claim 1, wherein the switching means for setting and resetting the first latch circuit comprise a further controlling field-effect transistor which is connected in series with the controlling field-effect transistor and to which a setting signal is applied, and a further controlling field-effect transistor which is connected in series with the latter and to which a resetting signal is applied.

5. Flip-flop circuit according to claim 4, wherein the controlling field-effect transistors in the first latch circuit are p-channel field-effect transistors.

6. Flip-flop circuit according to claim 1, wherein the switching means for setting and resetting the second latch circuit comprise a circuit comprising a further controlling field-effect transistor, to which the negated resetting signal is applied, connected in series with a further controlling field-effect transistor to which the setting signal is applied, which circuit is coupled to the output of the second latch circuit.

7. Flip-flop circuit according to claim 6, wherein the controlling field-effect transistors in the second flip-flop circuit are n-channel field-effect transistors.

8. Flip-flop circuit according to claim 7, wherein also connected to the output of the second latch circuit is a p-channel controlling field-effect transistor to which the negated resetting signal is applied.

* * * * *